United States Patent
Balluchi

(10) Patent No.: US 6,507,534 B2
(45) Date of Patent: Jan. 14, 2003

(54) COLUMN DECODER CIRCUIT FOR PAGE READING OF A SEMICONDUCTOR MEMORY

(75) Inventor: Daniele Balluchi, Agrate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 3 days.

(21) Appl. No.: 09/797,171

(22) Filed: Feb. 27, 2001

(65) Prior Publication Data

US 2001/0028598 A1 Oct. 11, 2001

(30) Foreign Application Priority Data

Feb. 29, 2000 (EP) .............................................. 00830149

(51) Int. Cl.[7] ................................................ G11C 7/00
(52) U.S. Cl. ........................... 365/230.06; 365/230.01; 365/230.02; 365/230.03; 365/231
(58) Field of Search ........................ 365/230.01, 230.02, 365/230.03, 230.06, 231

(56) References Cited

U.S. PATENT DOCUMENTS

| | | | |
|---|---|---|---|
| 5,179,687 A | * 1/1993 | Hidaka et al. | 711/118 |
| 5,285,421 A | 2/1994 | Young et al. | 365/230.04 |
| 5,353,427 A | * 10/1994 | Fujishima et al. | 365/230.03 |
| 5,500,819 A | * 3/1996 | Runas | 365/189.05 |
| 5,696,917 A | 12/1997 | Mills et al. | 395/401 |
| 5,835,436 A | * 11/1998 | Ooishi | 365/230.03 |
| 5,901,086 A | * 5/1999 | Wang et al. | 365/185.21 |
| 5,901,105 A | * 5/1999 | Ong et al. | 365/230.06 |
| 5,999,451 A | * 12/1999 | Lin et al. | 365/185.11 |
| 6,175,532 B1 | * 1/2001 | Ooishi | 365/230.03 |
| 6,212,111 B1 | * 4/2001 | Wright | 365/200 |
| 6,233,195 B1 | * 5/2001 | Yamazaki et al. | 365/230.03 |

* cited by examiner

Primary Examiner—Viet Q. Nguyen
(74) Attorney, Agent, or Firm—Lisa K. Jorgenson; David V. Carlson; Seed IP Law Group PLLC

(57) ABSTRACT

A column decoder circuit for page reading of a semiconductor memory includes a first level decoder stage, a second level decoder stage, and a plurality of bit selection stages, each comprising a plurality of selection branches; wherein each selection branch is connected to a respective input of a multiplexer and has a plurality of first level selector stages and a second level selector stage. Each second level selector stage comprises a first addressing selector for addressing a first group of bit lines. Each bit selection stage further comprises a second addressing selector for addressing a second group of bit lines, current and next page selectors for selecting one of the first and second groups of bit lines.

24 Claims, 11 Drawing Sheets

| ADD$_{1-0}$ | YM$_0$ | YM$_1$ | YM$_2$ | YM$_3$ | YM$_4$ | YM$_5$ | YM$_6$ |
|---|---|---|---|---|---|---|---|
| 00 | 1 | 1 | 1 | 1 | 0 | 0 | 0 |
| 01 | 0 | 1 | 1 | 1 | 1 | 0 | 0 |
| 10 | 0 | 0 | 1 | 1 | 1 | 1 | 0 |
| 11 | 0 | 0 | 0 | 1 | 1 | 1 | 1 |

| ADDYM1 | ADDYM0 | YM0 | YM1 | YM2 | YM3 | YM4 | YM5 | YM6 |
|---|---|---|---|---|---|---|---|---|
| 0 | 0 | 1 | 1 | 1 | 1 | 0 | 0 | 0 |
| 0 | 1 | 0 | 1 | 1 | 1 | 1 | 0 | 0 |
| 0 | 0 | 0 | 0 | 1 | 1 | 1 | 1 | 0 |
| 0 | 1 | 0 | 0 | 0 | 1 | 1 | 1 | 1 |

COLUMN DECODER CIRCUIT FOR PAGE READING OF A SEMICONDUCTOR MEMORY

TECHNICAL FIELD

The present invention refers to a column decoder circuit for page reading of a semiconductor memory.

BACKGROUND OF THE INVENTION

It is known that reducing the time for reading semiconductor memories currently represents a problem of considerable importance.

In particular, it is known that the data contained in a memory are not immediately available as soon as a reading operation is requested. In fact, it is necessary to wait for a latency time required for decoding the addresses of the memory words to be read (addressing of the memory), for selecting the memory cells, and transferring the information on a data bus.

Column decoder circuits have thus been studied that enable simultaneous reading of a number of memory words, if these are set in consecutive memory locations (the reading of series of consecutive memory words, known as "burst-mode" reading, is in fact a frequent case). The memory words read are supplied in succession on a data bus at every clock cycle, so as to eliminate or reduce the latency times.

For greater clarity, reference is made to FIG. 1, which shows a column decoder circuit 1 of a known type, in particular having 128 columns per bit and allowing simultaneous reading of four memory words having consecutive addresses (memory pages). The column decoder circuit 1, belonging to a semiconductor memory, comprises a first level decoder stage 2, a second level decoder stage 3, and a plurality of bit selection stages 4. In particular, the bit selection stages 4 are equal in number to the bits forming a memory word (for example, 16).

The first level decoder stage 2 has an input connected to an address bus 5, from which it receives two first level address bits, and is connected at the output to a first level bus 7 to supply four first level signals $YO_0, \ldots, YO_3$, each having a selection value and a deselection value.

The second level decoder stage 3 has an input connected to an address bus 5, from which it receives three second level address bits, and is connected at the output to a second level bus 8 to supply eight second level signals $YN_0, \ldots, YN_7$, each having a selection value and a deselection value.

In particular, during reading, a single first level signal $YO_0, \ldots, YO_3$ and a single second level signal $YN_0, \ldots, YN_7$ at a time are set at the selection value, while all the other first level and second level signals have the deselection value.

Each of the bit selection stages 4 has first level inputs, connected to the first level bus 7, second level inputs, connected to the second level bus 8, and third level inputs, connected to the address bus 5, from which they receive two third level address bits. In addition, each of the bit selection stages 4 is connected to a respective group of bit lines 10 of a memory array (not shown), and has an output connected to a data bus 11. Each group of bit lines 10 comprises, for example, 128 bit lines 10, identified in FIG. 1 by a progressive number between 0 and 127, corresponding to a column address of a memory word.

FIG. 2 shows in greater detail a block diagram of a bit selection stage 4, which comprises first level selector stages 15, second level selector stages 16, column amplifiers 14, also referred to as sense amplifiers, and a multiplexer 12.

Each first level selector stage 15 is connected to the first level bus 7 supplying the first level signals $YO_0, \ldots, YO_3$, and to four bit lines 10. In particular, the bit lines 10 connected to a same first level selector stage 15 have column addresses k, k+32, k+64, k+96 (k=0, 1, …, 31).

Each second level selector stage 16 is connected to the second level bus 8, supplying the second level signals $YN_0, \ldots, YN_7$, and to eight first level selector stages 15.

The multiplexer 12 is connected to the second level selector stages 16 via the column amplifiers 14 and pass transistors 18. In addition, the multiplexer 12 is connected to the address bus 5, supplying the third level address bits, and has an output connected to the data bus 11.

FIG. 3 shows a circuit diagram of the bit selection stage 4 shown in FIG. 2.

According to the values of the first level signals $YO_0, \ldots, YO_3$, each first level selector stage 15 selects and connects one of the bit lines 10 to the respective second level selector stage 16. For example, all the lines having column address k+32 (wherein k=0, 1, …, 31) are selected. Likewise, each second level selector stage 16, according to the values of the second level signals $YN_0, \ldots, YN_7$, selects and connects a first level selector stage 15 to the respective column amplifier 14. In practice, four bit lines 10 having consecutive addresses are selected simultaneously, so that the content of four memory cells (not shown) connected to the selected bit lines 10 is available at the inputs of the multiplexer 12. If it is necessary to read one or more memory pages, in successive clock cycles, the multiplexer 12 sets the data present on its own inputs in sequence on the data bus 11.

In known column decoder circuits, however, it is disadvantageous that simultaneous reading of four memory words is possible only if the address of the first memory word to be read can be divided by four. Otherwise, it would be necessary to have available, for each second level selector stage 16, a set of independent values of the second level signals $YN_0, \ldots, YN_7$, while there are present a single second level decoder stage 3 and a single second level bus 8. Suppose, for example, that it is required to read memory words having column addresses 1, 2, 3 and 4. The bit lines 10 for the column addresses 1, 2 and 3 can be selected by setting the second level signal $YN_0$ at the selection value, which, however, selects the bit line 10 for the column address 0, instead of the one having column address 4 (FIGS. 2 and 3). Consequently, in this case it is possible to read only three valid memory words simultaneously.

SUMMARY OF THE INVENTION

According to principles of the present invention, a column decoder circuit is provided that enables reading of memory pages independently of the initial column address. A column decoder circuit is provided for page reading of a semiconductor memory that includes a circuit.

BRIEF DESCRIPTION OF THE DRAWINGS

For a better understanding of the invention, an embodiment thereof is now described, simply to provide a non-limiting example, with reference to the attached drawings, in which.

DETAILED DESCRIPTION OF THE INVENTION

Figure 1:
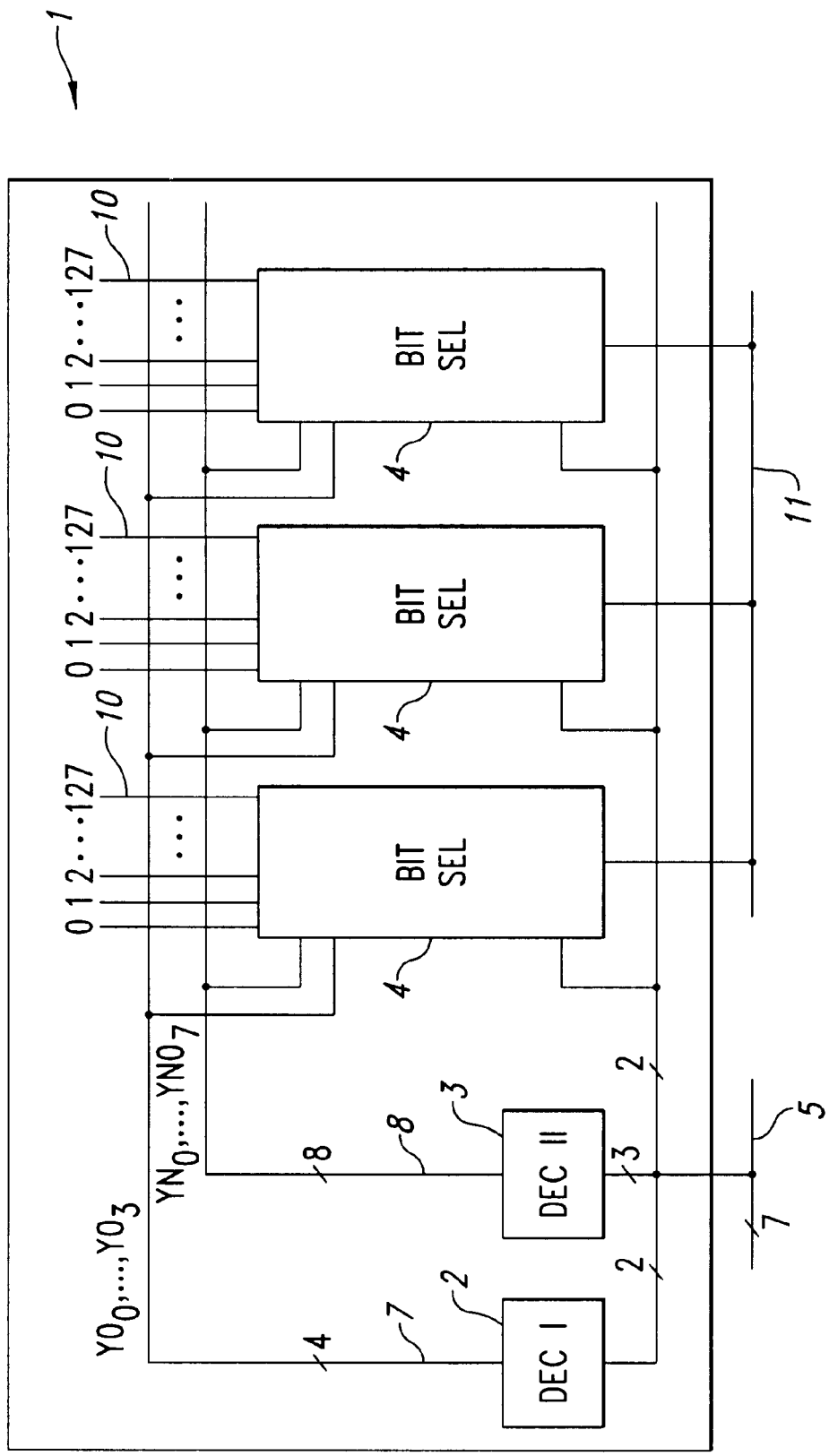
FIG. 1 illustrates a simplified block diagram of a column decoder circuit of a known type.
Figure 2:
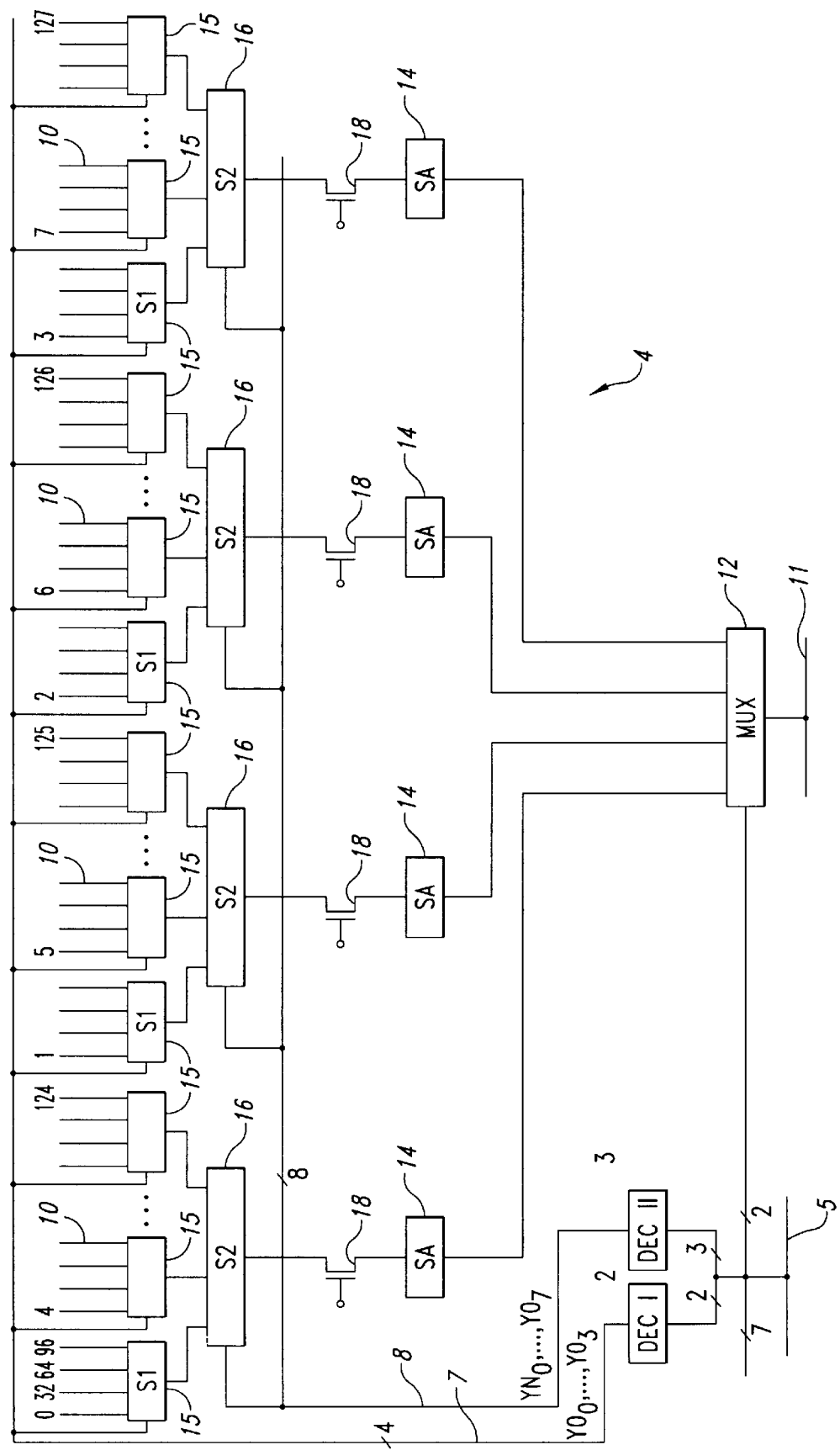
FIG. 2 illustrates a more detailed diagram of a block of the column decoder circuit of FIG. 1.
Figure 3A:
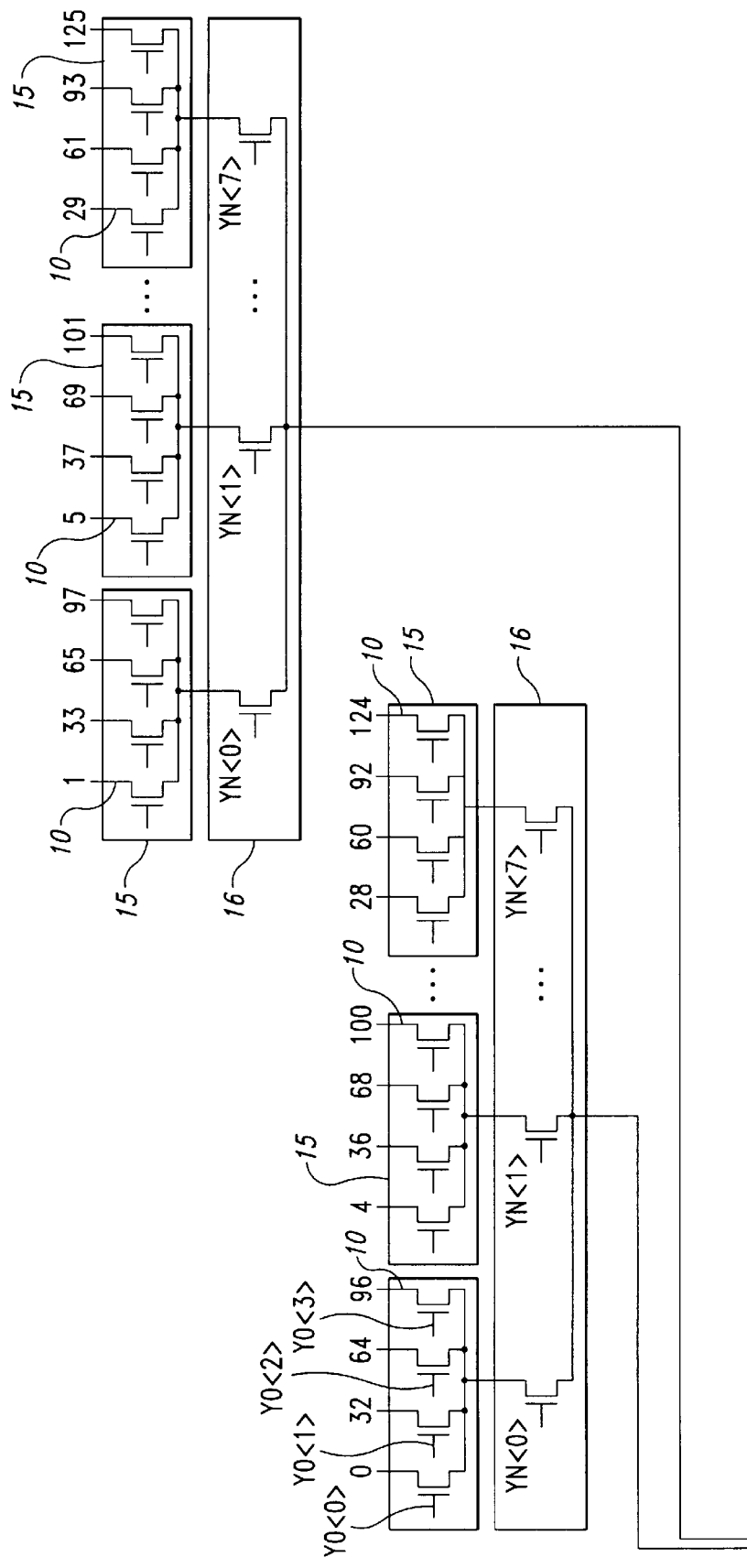
FIG. 3 shows a simplified circuit diagram of the block of FIG. 2.
Figure 3B:
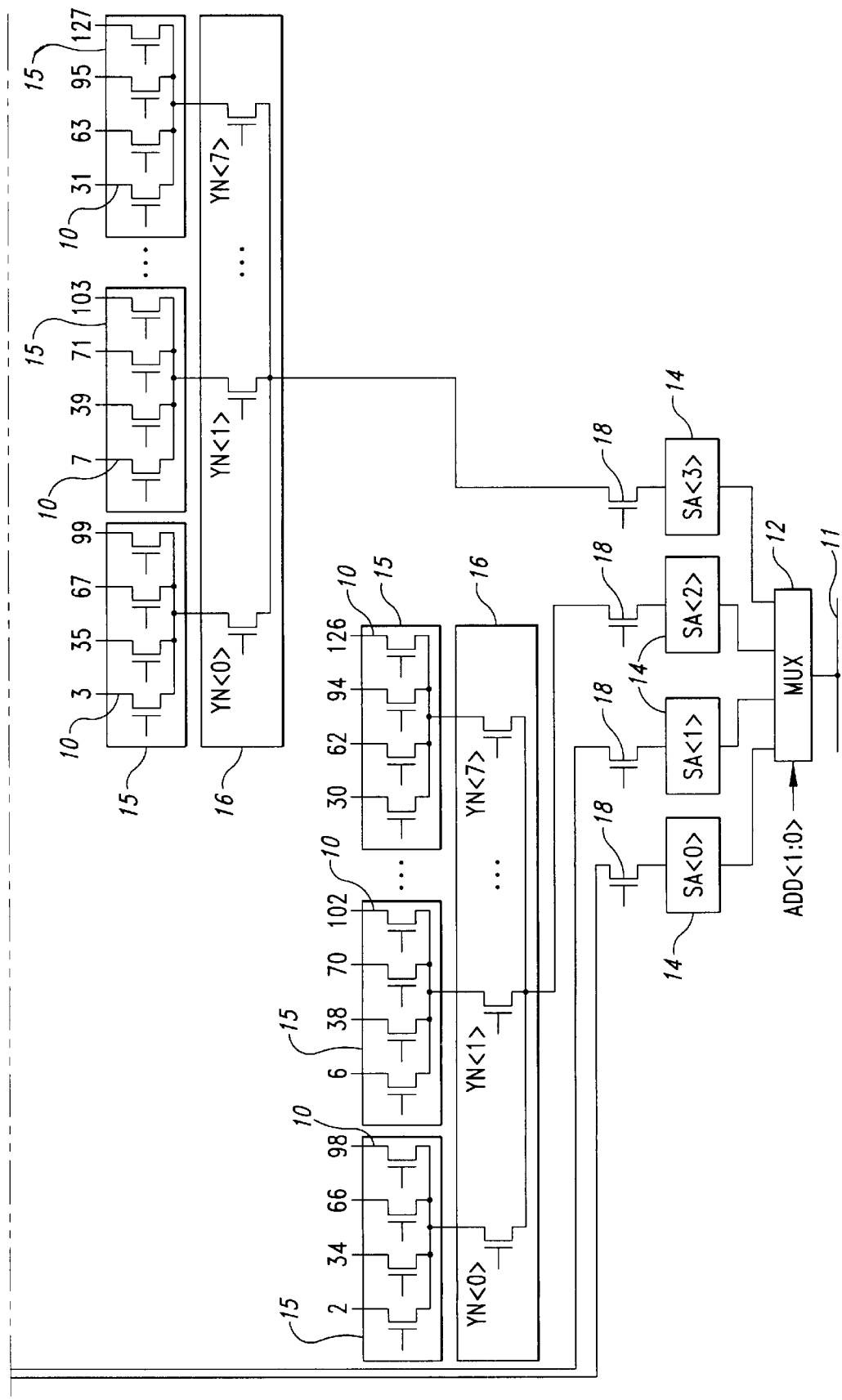
Figure 4:
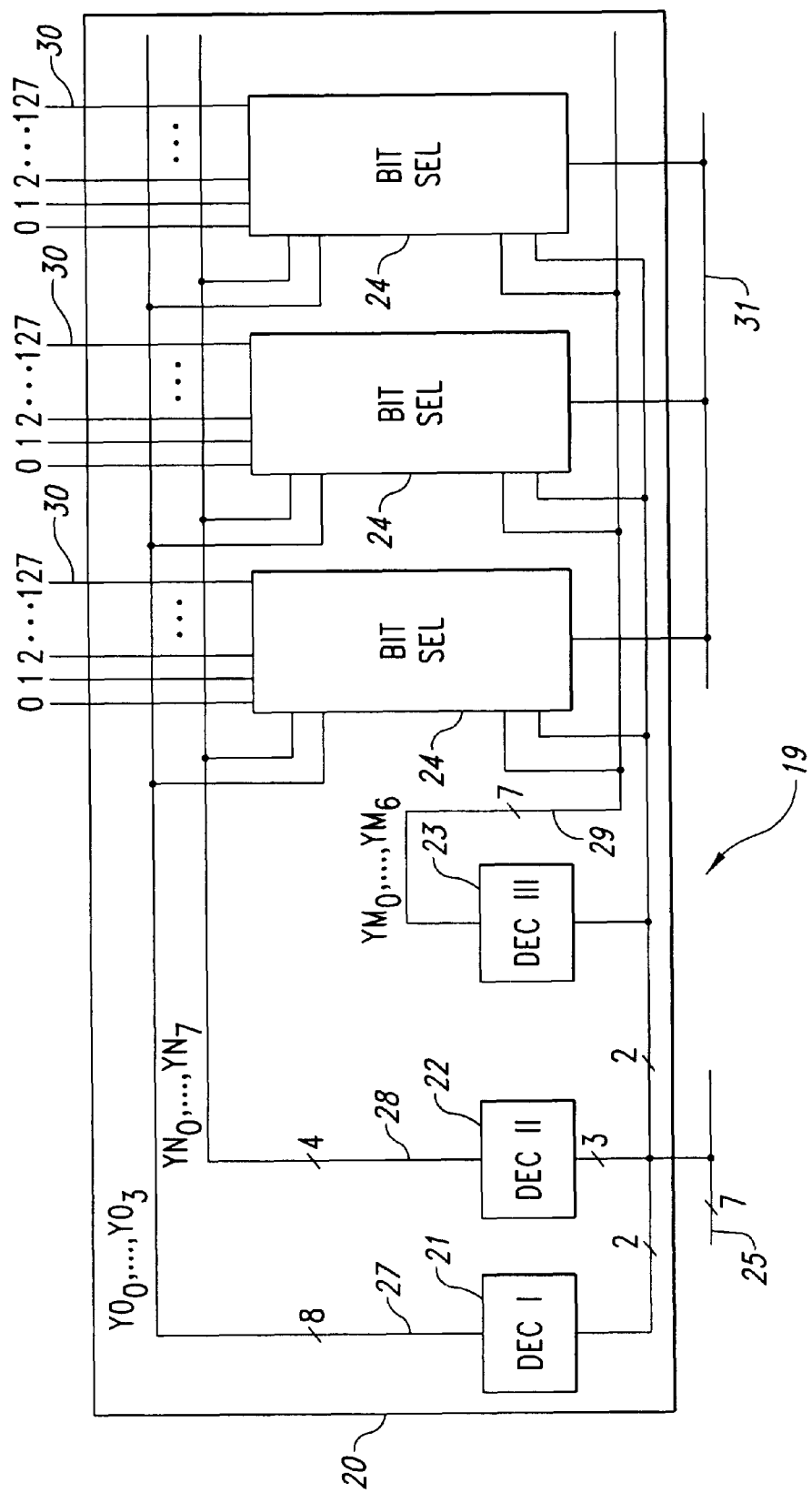
FIG. 4 illustrates a simplified block diagram of a column decoder circuit according to the present invention.

FIG. 4 illustrates a column decoder circuit 20 belonging to a memory 19, in particular having 128 columns per bit and allowing simultaneous reading of four memory words having consecutive addresses (memory pages). The column decoder circuit 20 comprises a first level decoder stage 21, a second level decoder stage 22, a third level decoder stage 23, and a plurality of bit selection stages 24. In particular, the bit selection stages 24 are equal in number to the bits that form a memory word, for instance, 16.

Figure 5A:
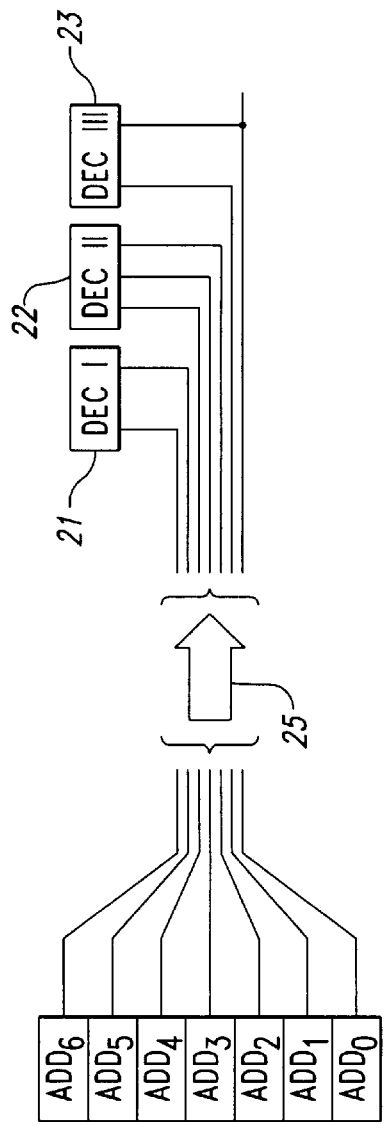
FIG. 5a illustrates a detail of the block diagram of FIG. 4.

The first level decoder stage 21 receives from an address bus 25 two first level address bits $ADD_6$, $ADD_5$ (see FIG. 5a) and supplies to a first level bus 27 four first level signals $YO_0 \ldots, YO_3$, each having a selection value, which is logic value '1,' and a deselection value, which is logic value '0.'

The second level decoder stage 22 receives from the address bus 25 three second level address bits $ADD_4$–$ADD_2$ (see FIG. 5a) and supplies to a second level bus 28 eight second level signals $YN_0 \ldots, YN_7$, each having a selection value and a deselection value.

The third level decoder stage 23 receives from the address bus 25 two third level address bits $ADD_1$, $ADD_0$ (FIG. 5a) and supplies to a third level bus 29 third level signals $YM_0 \ldots, YM_6$, each having a selection value and a deselection value. The decoder stage 23 is composed of memory elements and a combinatorial circuit for implementing the table of FIG. 11 based on the possible input combinations, as shown in FIG. 11. The operation of the circuit is described in more detail with respect to FIG. 11 and other figures herein. Given this description and FIG. 11, design and construction of a circuit to implement the table of FIG. 11 is quite straightforward and can be done by those of skill in the art. Thus, there are many combinations of elements, either in hardware or in software or in a combination of both, that can be used for the decoder stage 23.

Figure 5B:
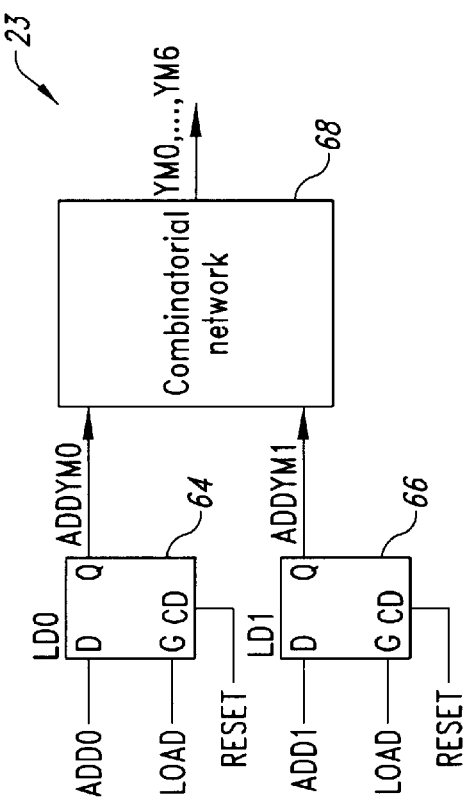
FIG. 5b illustrates one embodiment of the third decoder.
Figures 10, 11A, 11B:
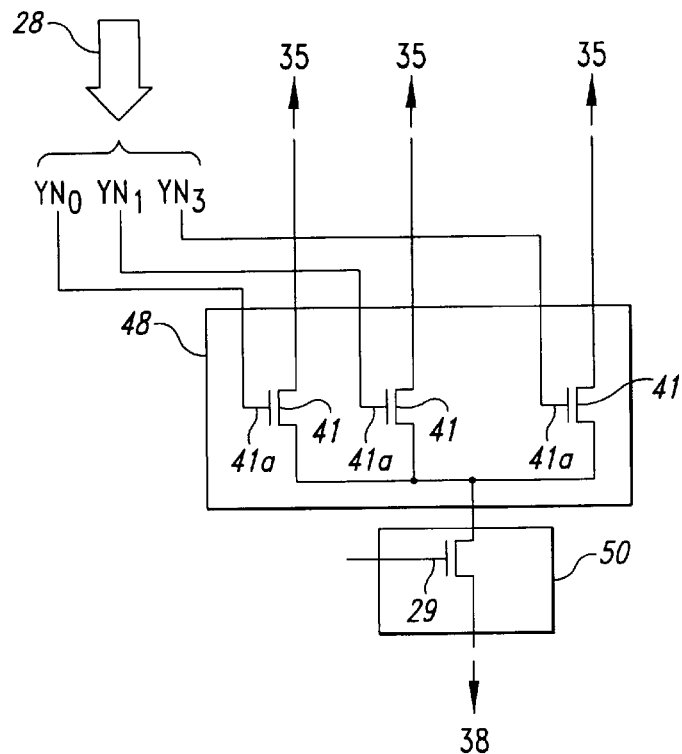
FIG. 11a shows a table for signals present in the column decoder circuit of FIG. 4.
FIG. 11b shows a second embodiment of the table for signals that may be used with the circuit of FIG. 5b.

FIG. 5b illustrates one acceptable circuit for use as the third level decoder stage 3. According to this particular circuit, the third level decoder stage includes two registers 64 and 66 having the appropriate inputs ADD0 and ADD1. The registers 64 and 66 output input to a combinatorial logic network 68 which provides the outputs. FIG. 11b illustrates the particular table which may be used with the circuit of FIG. 5b. FIG. 11a is the general case which will be applicable to a large number of circuits which may be designed, whereas the table of FIG. 11b is more specific to the circuit of FIG. 5b, which is one acceptable embodiment of the many potential embodiments of circuits which maybe used for the third level decoder stage 23.

Each of the bit selection stages 24 has first level inputs connected to the first level bus 27, second level inputs connected to the second level bus 28, and third level inputs connected to the third level bus 29. The bit selection stages 24 are directly connected also to the address bus 25 and receive therefrom the two third level address bits $ADD_1$, $ADD_0$. In addition, each of the bit selection stages 24 is connected to a respective group of bit lines 30 of a memory array (not shown) and has an output connected to a data bus 31. Each group of bit lines 30 is formed, for example, by 128 bit lines 30, identified in FIG. 4 with a progressive number between 0 and 127 corresponding to a column address of a memory word.

Figure 6:
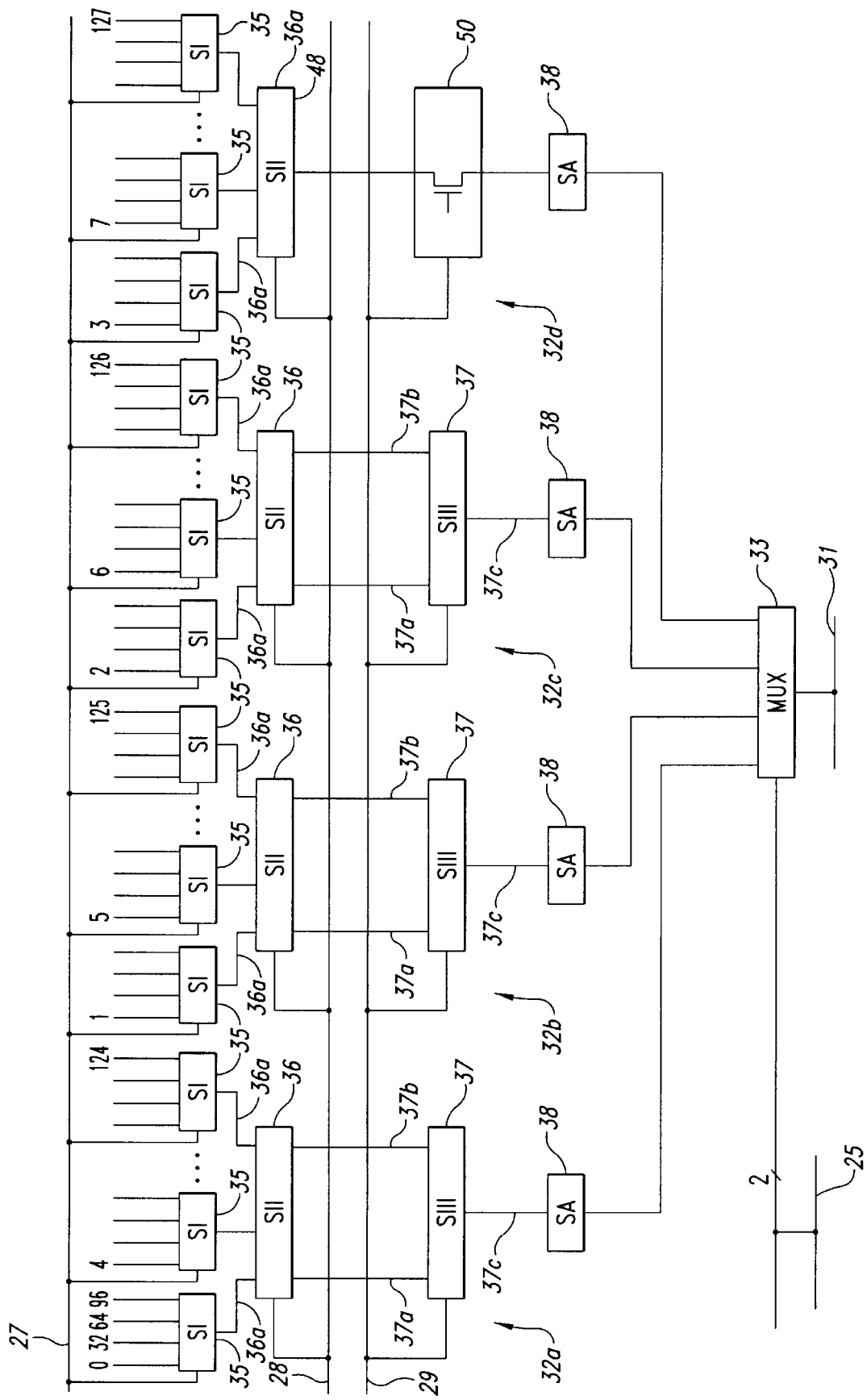
FIG. 6 illustrates a more detailed diagram of a block of the column decoder circuit of FIG. 4.

FIG. 6 shows a more detailed block diagram of a bit selection stage 24, which comprises a first, a second, and a third three-level selection branch 32a, 32b, 32c, and a two-level standard selection branch 32d. The three-level selection branches 32a, 32b, 32c and the standard selection branch 32d are connected, through respective column amplifiers 38, which are also referred to as sense amplifiers, to the inputs of a multiplexer 33, which has an output connected to the data bus 31.

The three-level selection branches 32a, 32b, 32c have the same architecture, and thus only the first three-level selection branch 32a will be described in detail hereinafter, with reference to FIGS. 6–9.

The first three-level selection branch 32a comprises a plurality of first level selector stages 35, a second level selector stage 36, and a third level selector stage 37.

Each first level selector stage 35 (eight, in the present embodiment) is connected to the first level bus 27 supplying the first level signals $YO_0 \ldots, YO_3$, and to four bit lines 30.

The second level selector stage 36 is connected to the second level bus 28, supplying the second level signals $YN_0 \ldots, YN_7$, and to eight first connection lines 36a, each of which is connected to a respective first level selector stage 35. In addition, the second level selector stage 36 is connected to a second connection line 37a and a third connection line 37b connected to the third level selector stage 37.

The third level selector stage 37 is connected to the third level bus 29, supplying a pair of third level signals $YM_0 \ldots, YM_6$, as illustrated in greater detail hereinafter, and is connected to a fourth connection line 37c connected to the respective column amplifier 38.

Figure 8:
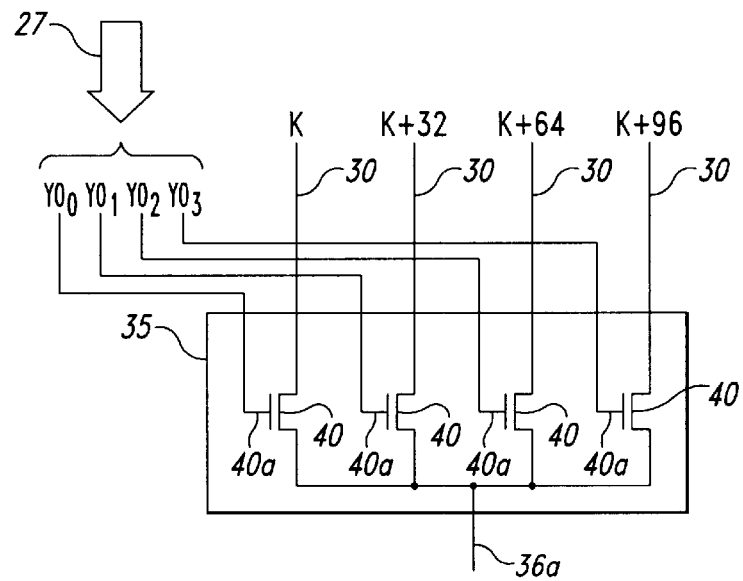
FIGS. 8, 9 and 10 illustrate more detailed circuit diagrams of particulars of the block of FIG. 6.

As shown in detail in FIG. 8, each of the eight first level selector stages 35 of the first selection branch 32a comprises four first level selectors 40, preferably formed by NMOS transistors, having their drain terminals connected to a respective bit line 30 and their source terminals connected together and to the first connection line 36a. In addition, each first level selector 40 has its gate terminal 40a connected to a respective line of the first level bus 27, so as to receive one of the first level signals $YO_0 \ldots, YO_3$.

Figure 9:
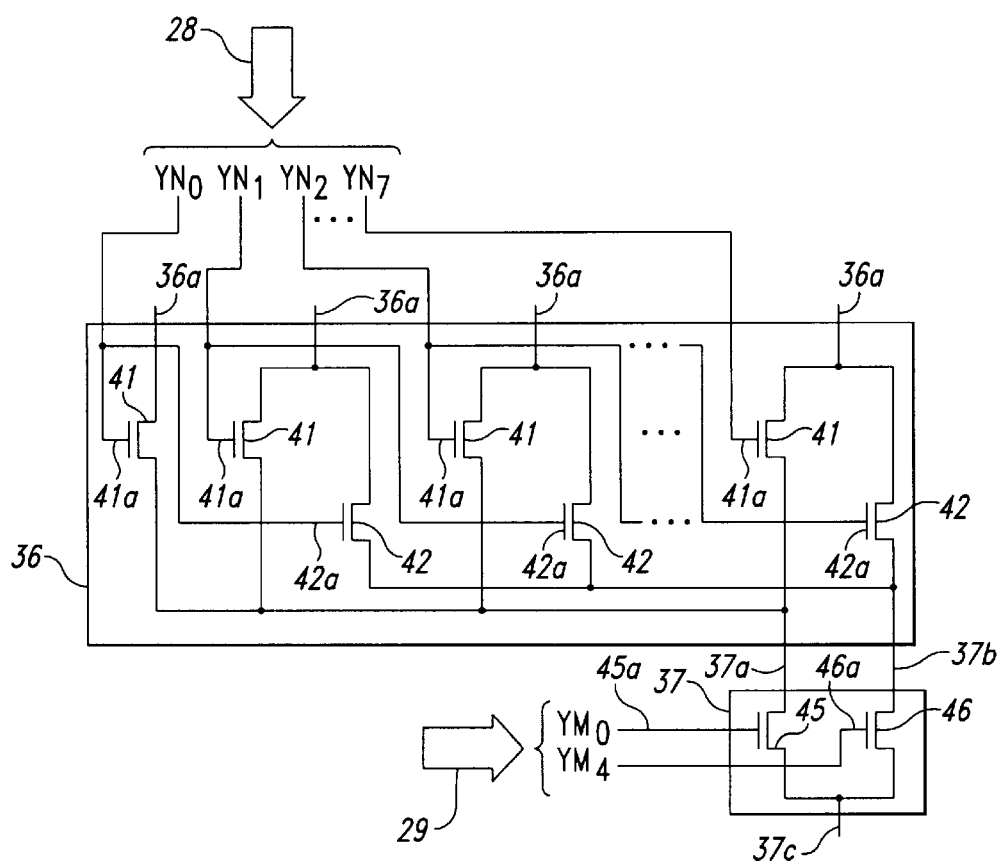

With reference to FIG. 9, the second level selector stage 36 of the first selection branch 32a comprises first and second intermediate selectors 41, 42 formed by NMOS transistors. In detail, the first intermediate selectors 41 have drain terminals connected to a respective connection line 36a and source terminals connected together and to the second connection line 37a. In addition, the second intermediate selectors 42 have drain terminals connected to seven of the eight first connection lines 36a and source terminals connected together and to the third connection line 37b.

Figure 7A:
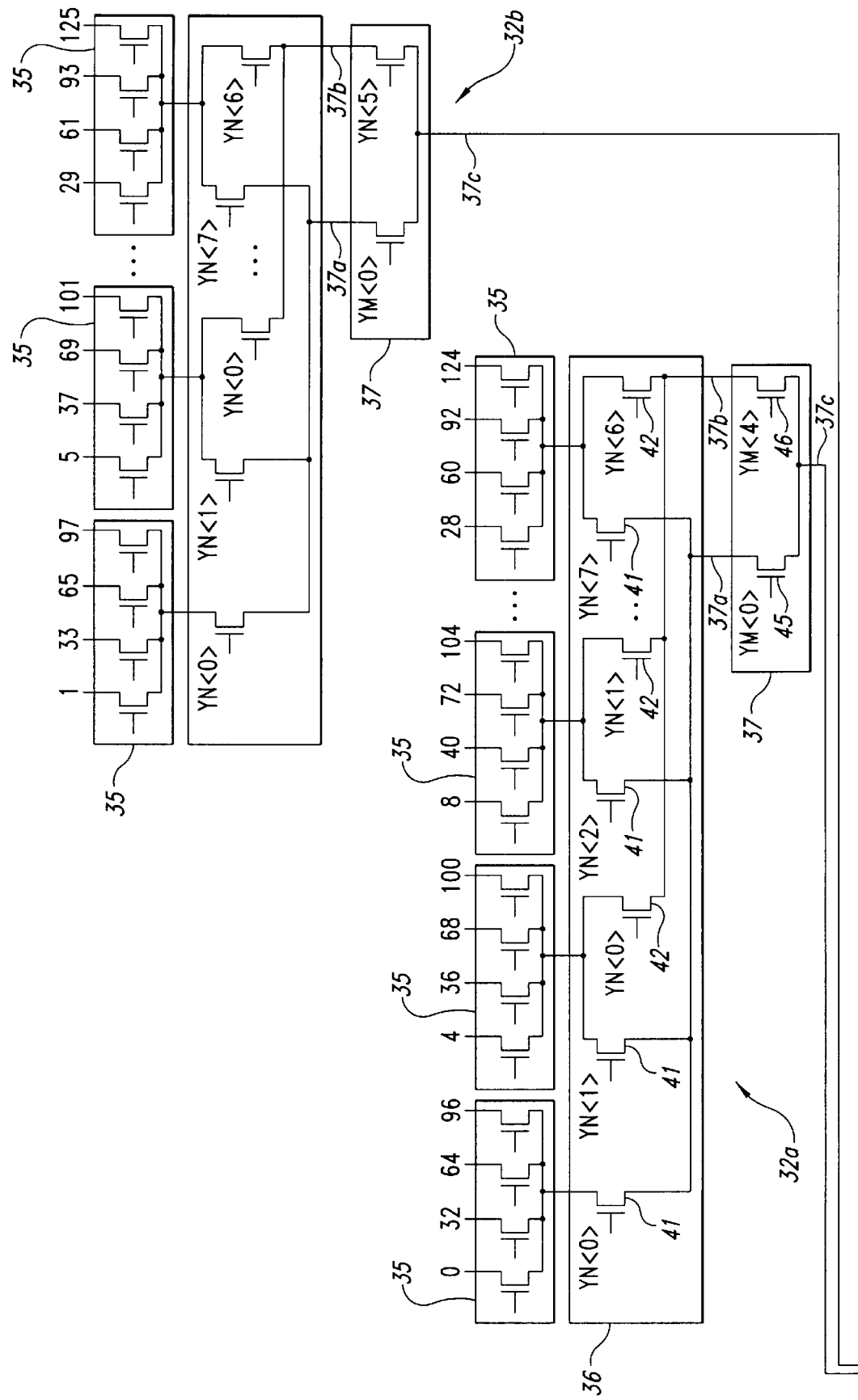
FIG. 7 illustrates a simplified circuit diagram of the block of FIG. 6.
Figure 7B:
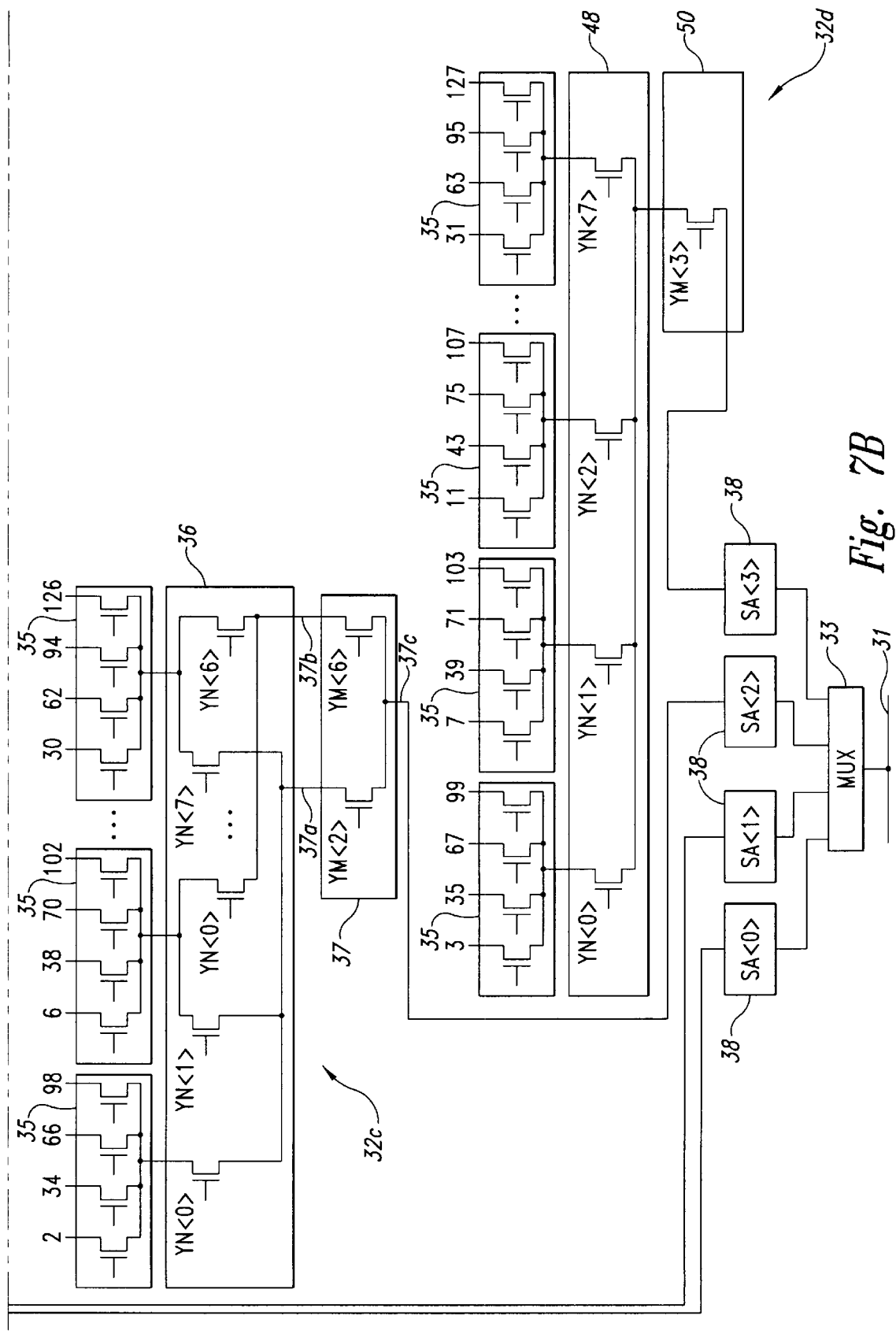

In this way, one of the first connection lines 36a is connected exclusively to the second connection line 37a, via the respective intermediate selector 41. The remaining seven first connection lines 36a are instead connected both to the second connection line 37a, via a respective first intermediate selector 41, and to the third connection line 37b, via a respective second intermediate selector 42 (FIGS. 7 and 9).

Gate terminals 41a of the first intermediate selectors 41 are connected to respective lines of the second level bus 28, so as to receive one of the second level signals $YN_0 \ldots$, $YN_7$, and, furthermore, are each connected to the gate terminal 42a of a second, adjacent, intermediate selector 42 (FIG. 9). Consequently, a first intermediate selector 41 and a second intermediate selector 42, which are adjacent and have respective gate terminals 41a, 42a in common, are simultaneously activated when the respective second level signal $YN_0 \ldots, YN_7$ it is brought to the selection value. In addition, the first intermediate selector 41, which receives at its gate terminal 41a the second level signal $YN_0$, is coupled between the first connection line 36a, which is connected exclusively to the second connection line 37a, and the second connection line 37a (FIG. 9).

The third level selector stage 37 comprises a current page selector 45 and a next page selector 46 formed by NMOS transistors having drain terminals connected to the second connection line 37a and, respectively, to the third connection line 37b, source terminals connected together and to the fourth connection line 37c, and gate terminals 45a, 46a connected to two respective lines of the third level bus 29, supplying the third level signals $YM_0$, $YM_4$. Likewise, as shown in FIG. 7, the second three level selection branch 32b receives the third level signals $YM_1$, $YM_5$, and the third three level selection branch 32c receives the third level signals $YM_2$, $YM_6$.

With reference again to FIG. 6, the standard selection branch 32d comprises eight first level selector stages 35, a standard selector stage 48 and a standard selector 50. The first level selector stages 35, which are identical to the first level selector stages 35 of the three level selection branches 32a–32c, and thus have already been described with reference to FIG. 8, have respective outputs connected to the standard selector stage 48. As shown in FIG. 10, the standard selector stage 48 comprises eight first intermediate selectors 41 having drain terminals connected to the output of a respective first level selector stage 35, source terminals connected together and to the corresponding column amplifier 38 via the standard selector 50, and gate terminals 41a connected to respective lines of the second level selection bus 28 to receive the second level signals $YN_0 \ldots, YN_7$.

The standard selector 50 formed by an NMOS transistor having its gate terminal connected to the third level bus 29, supplying a third level signal $YM_0 \ldots, YM_6$, in particular a single third level signal $YM_3$ not supplied to the three level selection branches 32a, 32b, 32c.

As shown in FIGS. 6–8, the bit lines 30 connected to a same first level selector stage 35 are identified by column addresses k, k+32, k+64, k+96 (k=0, 1, ..., 31).

In addition, the column addresses that identify the bit lines 30 can be divided into four classes, 0–3, corresponding, respectively, to the three-level selection branches 32a, 32b, 32c and to the standard selection branch 32d. Specifically, class 0 comprises the column addresses that are integer multiples of 4, i.e., equal to 4k (k=0, 1, ..., 31), and are associated with values '00' of the third level address bits $ADD_1$, $ADD_0$; class 1 contains the column addresses which, divided by 4, give as remainder 1, i.e., the column addresses 4k+1 (k=0, 1, ..., 31), and are associated with values '01' of the third level address bits $ADD_1$, $ADD_0$; class 2 contains the column addresses which, divided by 4, give as remainder 2, ie., the column addresses 4k+2 (k=0, 1, ..., 31), and are associated with values '10' of the third level address bits $ADD_1$, $ADD_0$; and class 3 contains the column addresses which, divided by 4, give as remainder 3, i.e., the column addresses 4k+3 (k=0, 1, ..., 31), and are associated with values '11' of the third level address bits $ADD_1$, $ADD_0$.

All the bit lines 30 identified by column addresses belonging to class 0 are connected to the first three-level selection branch 32a; all the bit lines 30 identified by column addresses belonging to class 1 are connected to the second three-level selection branch 32b; all the bit lines 30 identified by column addresses belonging to class 2 are connected to the third three-level selection branch 32c; and all the bit lines 30 identified by column addresses belonging to class 3 are connected to the standard selection branch 32d.

The operation of the column decoder circuit 20 is described below.

For a clearer understanding, some of the terms used are defined. By "physical page" is meant a group of four bit lines 30 identified by consecutive column addresses and connected in order, starting from the bit line 30 having the lowest column address, to the first, second, and third three-level selection branches 32a, 32b, 32c, and to the standard selection branch 32d. For example, the bit lines 30 identified by the column addresses 4, 5, 6 and 7 form a physical page, see FIGS. 6 and 7. In addition, since the four words to be read may not belong to the same physical page, as defined above, by "current physical page" is meant the physical page to which the first of the four words to be read belongs. For example, if it is required to read memory words having addresses 5, 6, 7 and 8, the current physical page is the physical page comprising the bit lines identified by the column addresses 4, 5, 6 and 7, FIGS. 6 and 7.

When page reading of the memory is executed, i.e., when memory words having consecutive addresses are simultaneously read, initially reading is requested of a virtual page comprising the first four words to be acquired. The column address of the first memory word to be read is loaded on address bus 25. The virtual page coincides with the physical page if the column address of the first word to be read belongs to class 0. Otherwise, the virtual page comprises words having column addresses included in the current physical page and words having column addresses included in a subsequent physical page. For example, if the column address of the first word to be read is 5, the virtual page comprises the words having column addresses 5, 6, 7 and 8, the current physical page comprises the bit lines 30 having column addresses 4, 5, 6 and 7, and the subsequent physical page comprises the bit lines 30 having column addresses 8, 9, 10 and 11.

According to the column address present on the address bus 25, one of the first level signals $YO_0, \ldots, YO_3$ and one of the second level signals $YN_0, \ldots, YN_7$ is set at the selection value, and all the other signals are kept at the deselection value. In this way, in each first level selector stage 35, the first level selector 40 is activated, which receives the first level signal $YO_0, \ldots, YO_3$ set at the selection value, and the corresponding bit line 30 is connected to the respective second level selector stage 36 (to the standard selector stage 48 in the case of the standard selection branch 32d). For example, all the lines having column address k+32 (k=0, 1, ..., 31) are selected.

In addition, in each second level selector stage 36 the first intermediate sector 41 and the second intermediate sector 42 that receive the second level signal $YN_0, \ldots, YN_7$ set at the selection value, are closed. Consequently, in each of the three-level selection branches 32a, 32b, 32c, a bit line 30 belonging to the current physical page and a bit line 30 belonging to the subsequent physical page are selected and are connected, the former to its own second connection line 37a, and the latter to its own third connection line 37b (FIGS. 6 and 7).

At the same time, since in the standard selector stage 48 the first intermediate selector 41 that receives the second level signal $YN_0, \ldots, YN_7$ set at the selection value, is closed, a bit line 30 belonging to the current physical page is selected and is connected to the standard selector 50.

The third level address bits $ADD_1$, $ADD_0$ of the first memory word to be read is loaded into the memory elements of the third level decoder stage 23. Subsequently, the stored values are updated only when a variation in the group of first level address bits $ADD_6$, $ADD_5$ occurs.

The third level decoder stage 23 generates values of the third level signals $YM_0, \ldots, YM_6$ according to the values assumed by the stored third level address bits $ADD_1, ADD_0$, as shown in the table given in FIG. 11a. In particular, in the third level selector stages 37, the current page selector 45 or the next page selector 46 are alternatively closed. If the column address of the first word of the virtual page belongs to class 0, in all the third level selector stages 37 the respective current page selector 45 is closed. If, instead, the column address of the first word of the virtual page belongs to class 1, class 2 or class 3, the next page selector 46 is closed in the third level selector stages 37, respectively, of the first three-level selection branch 32a, of the first and second three-level selection branches 32a, 32b, and of the first, second and third three-level selection branches 32a, 32b and 32c (FIGS. 7 and 11a). The standard selector 50 of the standard selection branch 32d is, instead, always closed.

FIG. 11b provides a table of a particular embodiment for the inputs and outputs which may be used for the decoder circuit of FIG. 5b. The address inputs as shown in FIG. 11a are received by the circuit of FIG. 5b and are provided as inputs to registers 64 and 66 whose output is shown in FIG. 11b. Given the output of these registers, the combinatorial network 68 provides the output as shown in FIG. 11b for that particular circuit. As will be appreciated, one of skill in the art could easily construct a combinatorial network 68 which will provide the output table of FIG. 11b given the inputs as shown. The third level address bits ADD1, ADD0 of the first memory word to be read are loaded into the memory elements of the third level decoder stage 23 shown in FIG. 5b. Subsequently, the stored values ADDYM0, ADDYM1 are updated by activating a RESET signal only when a variation in the group of first level address bits ADD6, ADD5 occurs.

The combinatorial network of the third level decoder stage 23 generates values of the third level signals YM0, . . . , YM6 according to the values assumed by the stored values ADDYM0, ADDYM1, as shown in the table given in FIG. 11b.

In this way, the bit lines 30 having column addresses equal to the column addresses of the words forming the virtual page to be read are selected independently of the initial column address.

During a latency interval, the data supplied via the selected bit lines 30, corresponding to the memory words of the first virtual page the reading whereof is requested, are stored in registers present in the column amplifiers 38 and are made available to the inputs of the multiplexer 33. The presence of registers in a column amplifier, also called sense amplifiers, is well known in the art and any acceptable storage register of the many available in the art may be used.

Thus, the multiplexer 33 feeds the data bus 31, in sequence and in successive clock cycles, with the data present at its own inputs. At the same time, a new virtual page can be read and supplied to the data bus 31 immediately after the first virtual page.

The described column decoder circuit has the advantage of favoring simultaneous reading of a plurality of memory words. In fact, thanks to the presence of the third level selector stages 37, it is possible to perform page reading, even if the virtual page requested does not coincide with a physical page. In particular, four memory words can be read simultaneously even if the initial column address cannot be divided by four, provided the first level bits $ADD_6$, $ADD_5$ remains unvaried. Use of page reading is thus rendered more flexible and effective and, consequently, the overall efficiency of the memory is improved. In addition, this improvement in efficiency is achieved with a limited increase in the number of components.

Finally, numerous modifications and variations can be made to the column decoder circuit described herein, without thereby departing from the scope of the present invention.

In particular, the column decoder circuit can be adapted to memories having different characteristics. For example, by increasing the number of inputs of the first level and/or second level selector stages it is possible to decode column addresses for memories having a larger number of bit lines. In addition, the column decoder circuit may comprise a larger number of three-level selection lines, thus enabling reading of pages having a larger number of words.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A column decoder circuit for page reading of a semiconductor memory, comprising:

a first level decoder stage having an input connected to an address bus and an output connected to a first level bus;

a second level decoder stage having at input connected to said address bus and connected an output connected to a second level bus; and a plurality of bit selection stages, each including a plurality of selection branches and a multiplexer, said selection branches being connected to respective inputs of said multiplexer and having a plurality of first level selector stages and a second level selector stage, each of said first level selector stages being connected to said first level bus, to respective bit lines, and to a respective second level selector stage, each second level selector stage having a first addressing circuit for addressing a first group of bit lines;

a second addressing circuit for addressing a second group of bit lines, and a selection circuit for selecting one of said first and second groups of bit lines.

2. The column decoder circuit of claim 1 wherein one second addressing circuit is within each bit selection stage.

3. The circuit according to claim 1, wherein in each bit selection stage, at least one selection branch comprises a third level selector stage including said selection circuit, said third level selector stage being connected, through a first and a second connection, to a respective on of said second level selector stage, and, through a third connection, to said multiplexer.

4. The circuit according to claim 1, further including a third level decoder stage having an input connected to said address bus and an output connected to said third level selector stage through a third level bus.

5. The circuit according to claim 4, wherein said third level selector stage comprises a current page selector and a next page selector, said current page selector being connected between said first connection and said third connection and having a control terminal connected to said third level bus, said next page selector being connected between said second connection and said third connection and having a control terminal connected to said third level bus.

6. The circuit according to claim 4, wherein said control terminal of said current page selector and said control terminal of said next page selector are connected to distinct lines of said third level bus; said lines of said third level bus supplying third level signals generated by said third level decoder stage for activating alternatively one of said current page selector and said next page selector.

7. The circuit according to claim 3, wherein in said at least one selection branch, said second level selector stage comprises a plurality of first selectors connected to said first connection and a plurality of second selectors connected to said second connection.

8. The circuit according to claim 7, wherein said at least one selection branch, at least some of said first level selector stages are connected to a respective one of said first selector and to a respective one of said second selector of said second level selector stage.

9. The circuit according to claim 7, wherein said first and second selectors have respective control terminals connected to said first level bus; at least some of said first selectors having a control terminal connected to the control terminal of a second adjacent selector.

10. The circuit according to claim 7, wherein each bit selection stage comprises a respective standard selection stage having a plurality of further first level selector stages, a standard selector stage and a standard selector; said standard selector stage comprising a plurality of first selectors which are connected between respective outputs of said further first level selector stages and said standard selector and have respective control terminals connected to said second level bus; said standard selector being connected to a respective input of said multiplexer and having a control terminal connected to said third level bus.

11. A method for page reading of a semiconductor memory having a first level decoder stage having an input to an address bus and an output connected to a first level bus, a second level decoder stage having an input connected to said address bus and an output connected to a second level bus; and a plurality of bit selection stages, each bit selection stage comprising a plurality of selection branches and a multiplexer, said selection branches being connected to respective inputs of said multiplexer and having a plurality of first level selector stages and a second level selector stage; each of said first level selector stages being connected to said first level bus, to respective bit lines, and to a respective second level selector stage;

the method comprising:
  addressing a first group of bit lines;
  addressing a second group of bit lines, and
  selecting one of said first and second groups of bit lines.

12. A memory circuit comprising:
  a first level decoder stage having an input connected to an address bus and an output connected to a first level bus;
  a second level decoder stage having an input connected to said address bus and an output connected to a second level bus;
  a third level decoder stage having an input connect to said address bus and an output connect to a third level bus; and
  a plurality of bit selection stages, each including a plurality of selection branches and a multiplexer, said selection branches being connected to respective inputs of said multiplexer and having a plurality of first level selector stages, a plurality of second level selector stages and a plurality of third selector stages, each of said first level selector stages being connected to said first level bus, to respective bit lines, each second level selector stage, being connected to a plurality of outputs of the respective first level selector stage and to the second level bus, and each third level selector stage being connected a plurality of outputs of said respective second level selector stage and to the third level bus, and through an output to said multiplexer.

13. The column decoder circuit of claim 12 wherein one second addressing circuit is within each bit selection stage.

14. The circuit according to claim 12 wherein the third level decoder stage having an input connected to said address bus and an output connected to said third level selector stage through a third level bus.

15. The circuit according to claim 14 wherein said third level selector stage comprises a current page selector and a next page selector, said current page selector being connected between said first connection and said third connection and having a control terminal connected to said third level bus, said next page selector being connected between said second connection and said third connection and having a control terminal connected to said third level bus.

16. The circuit according to claim 14 wherein said control terminal of said current page selector and said control terminal of said next page selector are connected to distinct lines of said third level bus; said lines of said third level bus supplying third level signals generated by said third level decoder stage for activating alternatively one of said current page selector and said next page selector.

17. The circuit according to claim 13 wherein in said at least one selection branch, said second level selector stage comprises a plurality of first selectors connected to said first connection and a plurality of second selectors connected to said second connection.

18. The circuit according to claim 17 wherein said at least one selection branch, at least some of said first level selector stages are connected to a respective one of said first selector and to a respective one of said second selector of said second level selector stage.

19. The circuit according to claim 17 wherein said first and second selectors have respective control terminals connected to said first level bus; at least some of said first selectors having a control terminal connected to the control terminal of a second adjacent selector.

20. The circuit according to claim 17 wherein each bit selection stage comprises a respective standard selection stage having a plurality of further first level selector stages, a standard selector stage and a standard selector; said standard selector stage comprising a plurality of first selectors which are connected between respective outputs of said further first level selector stages and said standard selector and have respective control terminals connected to said second level bus; said standard selector being connected to a respective input of said multiplexer and having a control terminal connected to said third level bus.

21. A circuit comprising:
- a plurality of first decoder circuits each decoder circuit having an input coupled to an address bus and an output coupled to a first bus;
- a plurality of first selection circuits, each first selection circuit having a plurality of inputs each input coupled to a bit line, a control input coupled to the first bus and an output;
- a second decoder circuit having an input coupled to the address bus and an output coupled to a second bus; and
- a plurality of second selection circuit, each second selection circuit having a plurality of inputs such that each input of the second selection circuit is coupled to the output of a first selection circuit of the plurality of first selection circuits, a control input coupled to the second bus and a plurality of outputs each output being a selected bit line coupled to an output data bus.

22. The circuit according to claim 21 further comprising a third decoder circuit having an input coupled to the address bus and an output coupled to a third bus and a plurality of third selection circuits, each third selection circuit having a plurality of inputs coupled to the plurality of outputs of the second selection circuit, a control input coupled to the third bus and an output such that the output provides a selected bit line.

23. The circuit according to claim 22 wherein the plurality of third selection circuits further comprise a current page selector and a next page selector.

24. A column decoder circuit for page reading of a semiconductor memory, comprising:
- a first level decoder stage having an input connected to an address bus and an output connected to a first level bus;
- a second level decoder stage having an input connected to said address bus and an output connected to a second level bus;
- a third level decoder stage having an input connected to said address bus and an output connected to said third level selector stage through a third level bus;
- a plurality of bit selection stages, each including a plurality of selection branches and a multiplexer, said selection branches being connected to respective inputs of said multiplexer and having a plurality of first level selector stages and a plurality of second level selector stages each of said first level selector stages being connected to said first level bus, to respective bit lines, and to a respective second level selector stage, each second level selector stage having a first addressing circuit for addressing a first group of bit lines;
- a second addressing circuit for addressing a second group of bit lines, and
- a selection circuit for selecting one of said first and second groups of bit lines.

* * * * *